(12) United States Patent
Jeon et al.

(10) Patent No.: US 8,295,076 B2
(45) Date of Patent: Oct. 23, 2012

(54) VARIABLE RESISTANCE MEMORY DEVICES COMPENSATING FOR WORD LINE RESISTANCE

(75) Inventors: Young-Joo Jeon, Suwon-si (KR); Kwang-Woo Lee, Hwaseong-si (KR); Daewon Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 304 days.

(21) Appl. No.: 12/819,341

(22) Filed: Jun. 21, 2010

(65) Prior Publication Data

US 2010/0321981 A1 Dec. 23, 2010

(30) Foreign Application Priority Data

Jun. 23, 2009 (KR) .................... 10-2009-0056136

(51) Int. Cl.
*G11C 11/00* (2006.01)

(52) U.S. Cl. .................... 365/148; 365/163; 977/754

(58) Field of Classification Search .................... 365/46, 365/94, 100, 113, 129, 148, 163, 158; 257/2–5, 257/9, 296, E31.047, E27.006; 438/29, 95, 438/96, 166, 259, 365, 482, 486, 597; 977/754
See application file for complete search history.

(56) References Cited

U.S. PATENT DOCUMENTS

| 7,480,167 B2 | 1/2009 | Ahn |
| 7,495,984 B2 * | 2/2009 | Kim et al. .................. 365/210.1 |
| 7,633,100 B2 * | 12/2009 | Cho et al. ..................... 257/256 |
| 2007/0034908 A1 * | 2/2007 | Cho et al. ..................... 257/260 |
| 2008/0123389 A1 * | 5/2008 | Cho et al. ..................... 365/148 |
| 2008/0159018 A1 | 7/2008 | Matano |
| 2008/0266942 A1 * | 10/2008 | Jeong et al. .................. 365/163 |
| 2009/0016100 A1 * | 1/2009 | Jeong ............................. 365/163 |
| 2009/0135642 A1 * | 5/2009 | Kim et al. ..................... 365/148 |
| 2009/0219750 A1 * | 9/2009 | Tokiwa et al. ................ 365/148 |
| 2009/0303785 A1 * | 12/2009 | Hwang et al. ................ 365/163 |
| 2010/0172171 A1 * | 7/2010 | Azuma et al. ................ 365/148 |

FOREIGN PATENT DOCUMENTS

| JP | 2005-196954 | 7/2005 |
| KR | 1020050070700 A | 7/2005 |
| KR | 1020070024803 A | 3/2007 |
| KR | 1020080023582 A | 3/2008 |

* cited by examiner

*Primary Examiner* — Richard Elms
*Assistant Examiner* — Harry W Byrne
(74) *Attorney, Agent, or Firm* — Myers Bigel Sibley & Sajovec, P.A.

(57) ABSTRACT

Memory devices include a row decoder, a first variable resistance memory cell connected to a first bit line and connected to the row decoder by a word line and a second variable resistance memory cell connected to a second bit line and connected to the row decoder by the word line. The memory devices further include a bit line select circuit coupled to the first and second bit lines and configured to compensate for a difference in word line resistance between the row decoder and the respective first and second memory cells. In some embodiments, the bit line select circuit includes first and second transistors configured to selective respective ones of the first and second bit lines and the first and second transistors have different resistances that compensate for the difference in word line resistance.

14 Claims, 10 Drawing Sheets

VARIABLE RESISTANCE MEMORY DEVICES COMPENSATING FOR WORD LINE RESISTANCE

CROSS-REFERENCE TO RELATED APPLICATIONS

This U.S. non-provisional patent application claims priority under 35 U.S.C. §119 of Korean Patent Application No. 10-2009-0056136, filed on Jun. 23, 2009, the entire contents of which are hereby incorporated by reference.

BACKGROUND

The present disclosure relates to memory devices and, more particularly, to variable resistance memory devices.

Semiconductor memory devices can store data and read the stored data when necessary. Semiconductor memory devices may be classified as volatile memory devices and nonvolatile memory devices.

Volatile memory devices lose their stored data when their power supplies are interrupted. Volatile memory devices may include SRAM, DRAM, SDRAM or the like. Nonvolatile memory devices maintain their stored data even when their power supplies are interrupted. Nonvolatile memory devices may include ROM, PROM, EPROM, EEPROM, flash memory device, PRAM, MRAM, RRAM, FRAM or the like.

SUMMARY

Some embodiments of the inventive subject matter provide memory devices including a row decoder, a first variable resistance memory cell connected to a first bit line and connected to the row decoder by a word line and a second variable resistance memory cell connected to a second bit line and connected to the row decoder by the word line. The memory devices further include a bit line select circuit coupled to the first and second bit lines and configured to compensate for a difference in word line resistance between the row decoder and the respective first and second memory cells. In some embodiments, the bit line select circuit includes first and second transistors configured to selective respective ones of the first and second bit lines and the first and second transistors have different resistances that compensate for the difference in word line resistance. For example, the first and second transistors may have different channel lengths that compensate for the difference in word line resistance and/or the first and second transistors may have different channel widths that compensate for the difference in word line resistance.

Further embodiments provide memory devices including a row decoder, a plurality of variable resistance memory cell blocks including a first variable resistance memory cell block coupled to the row decoder by a word line and a second variable resistance memory cell block coupled to the row decoder by the word line and first and second global bit lines coupled to respective ones of the first and second variable resistance memory cell blocks. The memory devices further include a global bit line select circuit coupled to the first and second bit lines and configured to compensate for a difference in word line resistance between the row decoder and the respective first and second variable resistance memory cell blocks.

In some embodiments, the global bit line select circuit includes respective first and second transistors configured to select respective ones of the first and second global bit lines, and the first and second transistors have different resistances to thereby compensate for the difference in word line resistance. For example, the first and second transistors may have different channel lengths that compensate for the difference in word line resistance and/or the first and second transistors may have different channel widths that compensate for the difference in word line resistance.

In further embodiments, the memory devices include a plurality of local bit lines, respective groups of which are configured to couple memory cells of respective ones of the variable resistance memory cell blocks to respective ones of the global bit lines, a plurality of global word lines and a plurality of local word lines, respective groups of which are coupled to respective ones of the global word lines. The memory devices may further include a local bit line selection circuit configured to selectively couple bit lines of the respective groups of local bit lines to respective ones of the global bit lines and further configured to compensate for differences in local word line resistance between the global word lines and memory cells in the variable resistance memory cell blocks. The local bit line select circuit may include respective local bit line select transistors configured to couple respective ones of the local bit lines to the global bit lines and the local bit line select transistors may have different resistances that compensate for the differences in local word line resistance.

BRIEF DESCRIPTION OF THE DRAWINGS

The accompanying drawings are included to provide a further understanding of the inventive subject matter, and are incorporated in and constitute a part of this specification. The drawings illustrate exemplary embodiments of the inventive subject matter and, together with the description, serve to explain principles of the inventive subject matter. In the figures.

DETAILED DESCRIPTION

Embodiments of the inventive subject matter will be described below in more detail with reference to the accompanying drawings. The embodiments of the inventive subject matter may, however, be embodied in different forms and should not be constructed as limited to the embodiments set forth herein. Rather, these embodiments are provided so that this disclosure will be thorough and complete, and will fully convey the scope of the inventive subject matter to those skilled in the art. Like numbers refer to like elements throughout.

Figure 1:
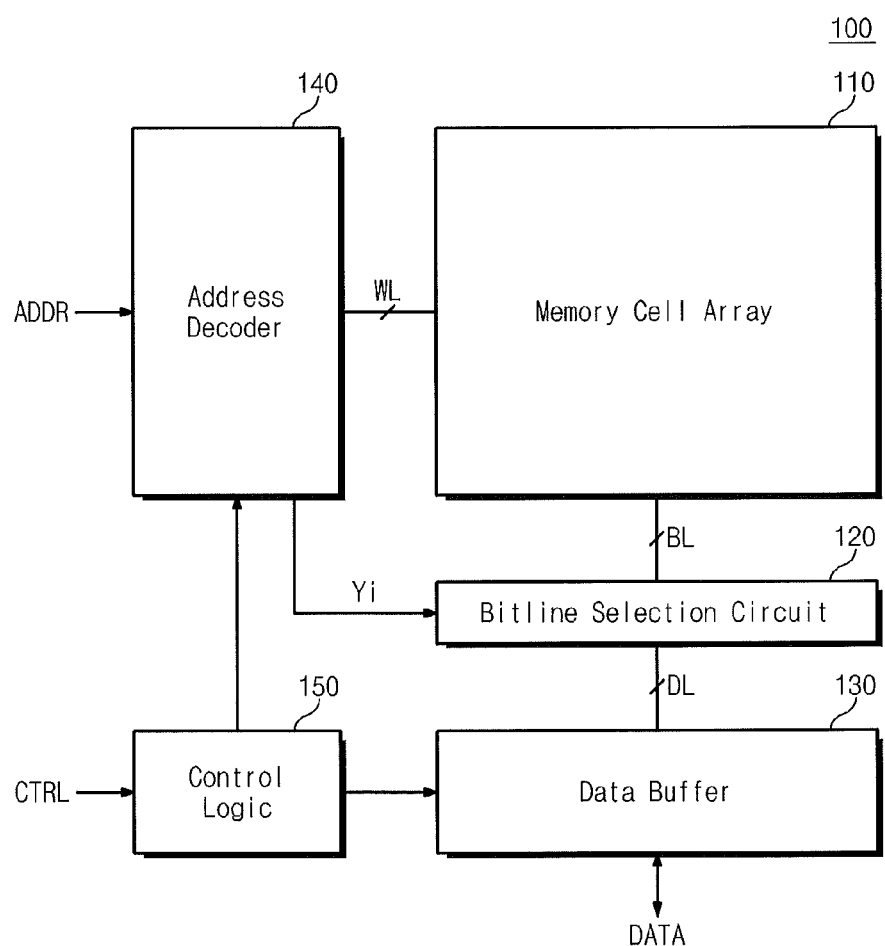
FIG. 1 is a block diagram illustrating a variable resistance memory device 100 in accordance with some embodiments of the present inventive subject matter.

FIG. 1 is a block diagram illustrating a variable resistance memory device 100 in accordance with some embodiments of the present inventive subject matter.

Referring to FIG. 1, the variable resistance memory device 100 includes a memory cell array 110, a bit line select circuit 120, a data buffer 130, an address decoder 140 and control logic 150.

The memory cell array 110 includes a plurality of variable resistance memory cells. For example, the variable resistance memory cells may be phase change memory (PRAM) cells, magnetic random access memory (MRAM) cells or resistance random access memory (RRAM) cells.

In the description that follows, it is assumed that variable resistance memory cells in accordance with some embodiments of the present inventive subject matter are phase change memory cells. However, the inventive subject matter is not limited thereto.

Phase change memory cells have resistances which are variable according to an applied temperature. For example, phase change memory cells have chalcogen compound of which a resistance is variable according to an applied temperature.

If a temperature higher than a melting temperature of chalcogen compound is applied to chalcogen compound for a short time, chalcogen compound transits to an amorphous state. If a temperature lower than a melting temperature of chalcogen compound is applied to chalcogen compound for a long time, chalcogen compound transits to a crystalline state. A resistance of chalcogen compound of a crystalline state is lower than a resistance of chalcogen compound of an amorphous state. A phase change memory device stores data by transiting chalcogen compound to an amorphous state or a crystalline state. The phase change memory cells in accordance with some embodiments of the present inventive subject matter will be described in detail with reference to FIGS. 2A and 2B.

Phase change memory cells may be connected to bit lines (BL) and word lines (WL) having a hierarchical structure. For example, bit lines (BL) may include local bit lines (LBL) and global bit lines (GBL). This will be described in FIG. 3 in detail. Word lines (WL) may include local word lines (LWL) and global word lines (GWL).

The bit line select circuit 120 is connected to the memory cell array 110 through bit lines. The bit line select circuit 120 selects bit lines in response to a control of the address decoder 140. The address decoder 140 generates a bit line select signal (Yi) for selecting a bit line. The bit line select circuit 120 selects bit lines in response to the bit line select signal (Yi).

The bit line select circuit 120 may include a plurality of column select transistors (not illustrated). For example, the column select transistor may be an NMOS transistor. However, the column select transistor in accordance with some embodiments of the present inventive subject matter is not limited thereto.

In some embodiments of the present inventive subject matter, the bit line select circuit 120 may include column select transistors having a hierarchical structure. The bit line select circuit 120 may include global column select transistors (not illustrated) and local column select transistors (not illustrated). This will be described in FIG. 3 in detail.

In some embodiments of the present inventive subject matter, column select transistors have different resistances to provide a uniform current to memory cells. That is, the column select transistors compensate for differences in word line parasitic resistance between each memory cell and the address decoder 140. The word line parasitic resistance may include an active resistance, a conductive resistance and so on. This will be described in FIGS. 3 through 7 in detail.

The data buffer 130 exchanges data with the outside. For example, the data buffer 130 may include a read circuit (not illustrated) and a write circuit (not illustrated). The data buffer 130 receives data stored in the memory cell array 110 through the bit line select circuit 120. The data buffer 130 transmits data received from the memory cell array 110 to the outside. The data buffer 130 also receives data from the outside. The data buffer 130 stores data transmitted from the outside in the memory cell array 110 through the bit line select circuit 120.

The address decoder 140 is connected to the memory cell array 110 through a word line (WL). The address decoder 140 may include a row decoder (not illustrated) and a column decoder (not illustrated). The row decoder decodes an address inputted from the outside to select a word line (WL). The column decoder generates a bit line select signal (Yi) for selecting a bit line (BL). The bit line select signal (Yi) is provided to the bit line select circuit 120.

The control logic 150 receives a control signal (CTRL) from the outside. The control logic 150 controls every operation of the variable resistance memory device 100 in response to the control signal (CTRL).

Figure 2A:
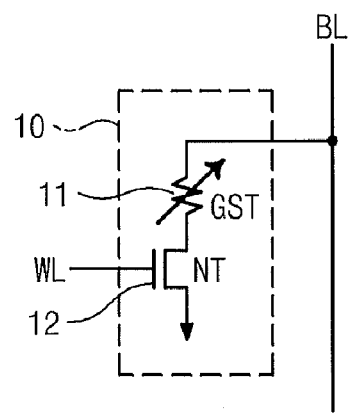
FIG. 2A is a drawing illustrating a phase change memory cell in accordance with some embodiments of the present inventive subject matter.

FIG. 2A illustrates a phase change memory cell in accordance with some embodiments of the present inventive subject matter.

Referring to FIG. 2A, a memory cell 10 includes a memory element 11 and a select element 12. The memory element 11 is connected between a bit line (BL) and the select element 12. The select device 12 is connected between the memory device 11 and a ground.

The memory element 11 includes a phase change material (GST). As described with reference to FIG. 1, a phase change material (GST) has an amorphous state or a crystalline state according to a temperature. A phase change material (GST) transits to an amorphous state or a crystalline state according to a current supplied through the bit line (BL). A phase change memory device programs data using the characteristic of the phase change material (GST).

The select element 12 may include an NMOS transistor (NT). A word line (WL) is connected to a gate of the NMOS transistor (NT). When a predetermined voltage is applied to the word line (WL), the NMOS transistor (NT) is turned on. If the NMOS transistor (NT) is turned on, the memory element 11 receives a current through the bit line (BL). In FIG. 2A, the memory element 11 is connected between the bit line (BL) and the select element 12. However, the select element 12 may be connected between the bit line (BL) and the memory element 11.

Figure 2B:
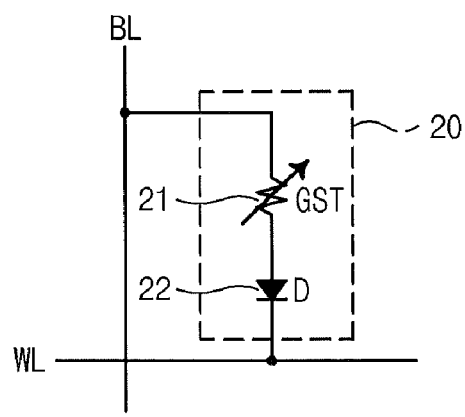
FIG. 2B is a drawing illustrating a phase change memory cell in accordance with further embodiments of the present inventive subject matter.

FIG. 2B illustrates a phase change memory cell in accordance with further embodiments of the present inventive subject matter.

Referring to FIG. 2B, a memory cell 20 includes a memory element 21 and a select element 22. The memory element 21 is connected between a bit line (BL) and the select element 22. The select element 22 is connected between the memory element 21 and a ground. Since the memory element 21 is identical to that of FIG. 2A, hereinafter, the select element 22 will be described in detail.

The select element 22 includes a diode (D). The memory element 21 is connected to an anode of the diode (D). A word line (WL) is connected to a cathode of the diode (D). When a voltage difference between an anode and a cathode of the diode (D) is higher than a threshold voltage of the diode (D), the diode (D) is turned on. If diode (D) is turned on, the memory element 21 receives a current through bit line (BL).

If a phase change material (GST) is heated at a temperature higher than a melting temperature by an applied current, and then is quenched, the phase change material (GST) transits to an amorphous state. An amorphous state is referred to as a 'reset state'. In this case, data '1' is stored in a memory cell. If a phase change material (GST) is heated at a temperature lower than a melting temperature and higher than the crystalline temperature by an applied current, and then slowly cooled, the phase change material (GST) transits to a crystalline state. The crystalline state is referred to as a 'set state'. In this case, data '0' is stored in a memory cell. However, that may be defined in other ways.

A resistance of a memory cell is changed according to an amorphous volume of a phase change material. A resistance of a memory cell is high when the memory cell is an amorphous state and is low when the memory cell is a crystalline state. As described above, a temperature of a memory cell is important so as to write data in a phase change memory cell. A temperature of a phase change memory cell is controlled by a level of a current provided to the memory cell.

Phase change memory cells are connected to the address decoder 140 through a word line (WL). A physical distance difference between each phase change memory cell and the address decoder 140 according to a location of each phase change memory cell on the memory cell array 110 is present. This means that different word line parasitic resistances are present according to lengths of word lines (WL) between the phase change memory cells and the address decoder 140.

Thus, a level of a current applied to phase change memory cells becomes different according to a value of a word line parasitic resistance. For example, if a word line parasitic resistance corresponding to a phase change memory cell is large, a level of a current applied to the corresponding phase change memory cell may be smaller than a reference level. If a word line parasitic resistance corresponding to a phase change memory cell is small, a level of a current applied to the corresponding phase change memory cell may be larger than a reference level. The difference of current level causes a reduction of a read margin (sensing). Thus, it is important that currents applied to phase change memory cells maintain a uniform level.

Also, an appliance of a uniform current is important in a reliability aspect of a memory cell. For example, memory cells to which currents greater than a reference current level are applied are disadvantageous in a disturb aspect. Thus, it is important that currents applied to phase change memory cells maintain a uniform level.

The bit line select circuit 120 compensates a difference of a word line parasitic resistance in accordance with a length of a word line between the address decoder 140 and a phase change memory cell to maintain a uniform current level. This will be described in FIGS. 3 through 7.

The variable resistance memory cell in accordance with the present inventive subject matter is not limited to a phase change memory cell. For example, the difference of word line parasitic resistance described above may be equally applied to a ferroelectric random access memory (FRAM), a magnetic random access memory (MRAM) and a resistance random access memory (RRAM).

Figure 3:
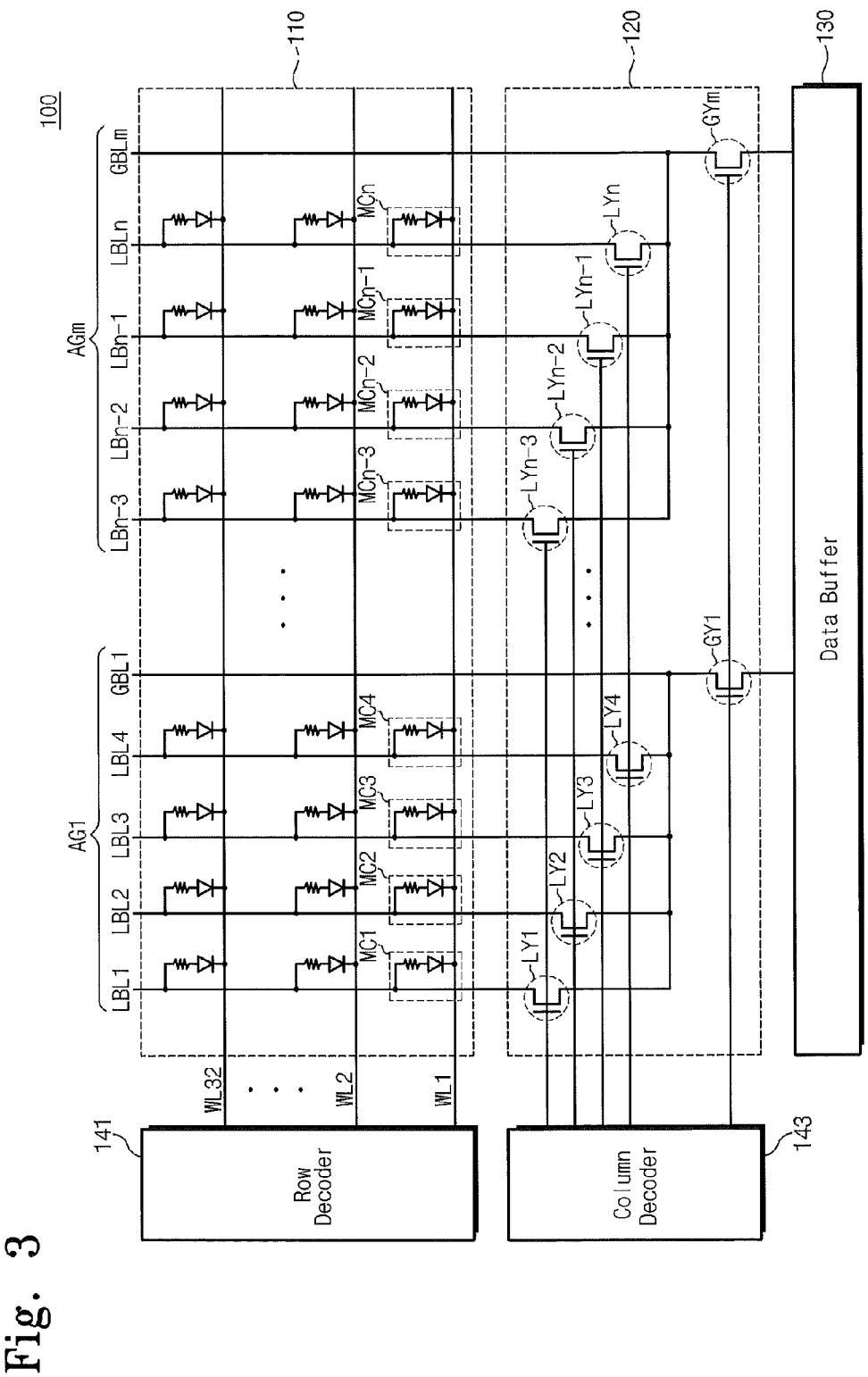
FIG. 3 is a block diagram illustrating a structure of the variable resistance memory device 100 illustrated in the FIG. 1 in detail.

FIG. 3 is a block diagram illustrating a structure of the variable resistance memory device 100 illustrated in the FIG. 1 in detail.

Referring to FIG. 3, the variable resistance memory device 100 includes a memory cell array 110, a bit line select circuit 120, a data buffer 130, a row decoder 141 and a column decoder 143. For a brief description, assume that the variable resistance memory is a phase change memory. It is assumed that phase change memory cells are the phase change memory cells illustrated in FIG. 2B.

For purposes of illustration, it is assumed that memory cells disposed between a first word line (WL1) and local bit lines (LBL1~LBL4) are first through fourth memory cells (MC1~MC4), respectively. It is assumed that memory cells disposed between the first word line (WL1) and local bit lines (LBLn-3~LBLn) are n-3th through nth memory cells (MCn-3~MCn).

The bit line select circuit 120 includes a plurality of column select transistors. Gates of column select transistors are connected to the column decoder 143. The column decoder 143 activates corresponding column select transistors in response to an address signal (ADDR). The activated column select transistors select corresponding bit lines (BL).

In some embodiments of the present inventive subject matter, column select transistors are connected to bit lines (BL) having a hierarchical structure. For a brief description, it is assumed that one global bit line (GBL) is electrically connected to four local bit lines (LBL). For example, it is assumed that a first global column select transistor (GY1) is activated to select a first global bit line (GBL1). It is assumed that a first global bit line (GBL1) is connected to first through fourth local column select transistors (LY1~LY4). It is assumed that the first through fourth local column select transistors (LY1~LY4) are activated to select first through fourth local bit lines (LBL1~LBL4).

Similarly, it is assumed that m global column select transistor (GYm) is activated to select mth global bit line (GBLm). It is assumed that mth global bit line (GBLm) is connected to n-3th through nth local column select transistors (LYn-3~LYn). It is assumed that the n-3th through nth local column select transistors (LYn-3~LYn) are activated to select n-3th through nth local bit lines (LBLn-3~LBLn).

The first through fourth local bit lines (LBL1~LBL4) electrically connected to a first global bit line (GBL1) and a first global select transistor (GY1) are called a first address group (AG1). The n-3th through nth local bit lines (LBLn-3~LBLn) electrically connected to mth global bit line (GBLm) and mth global select transistor (GYm) are called mth address group (AGm).

The bit line select circuit 120 in accordance with some embodiments of the present inventive subject matter compensates a parasitic resistance of a word line in accordance with a length of a word line (WL). More specifically, the local column select transistors (LY) have different resistances according to a distance between corresponding memory cell and the row decoder 141. The global column select transistors (GY) have different resistances according to a distance between corresponding address group (AG) and the row decoder 141.

A distance between the fourth memory cell (MC4) and the row decoder 141 is longer than a distance between the first memory cell (MC1) and the row decoder 141. This means that a word line parasitic resistance between the fourth memory cell (MC4) and the row decoder 141 is greater than a word line parasitic resistance between the first memory cell (MC1) and the row decoder 141. In this case, the fourth local column select transistor (LY4) has a resistance smaller than the first local column select transistor (LY1).

A distance between the mth address group (AGm) and the row decoder 141 is longer than a distance between the first address group (AG1) and the row decoder 141. This means that a word line parasitic resistance between the mth address group (AGm) and the row decoder 141 is greater than a word line parasitic resistance between the first address group (AG1) and the row decoder 141. In this case, the mth global column select transistor (GYm) has a resistance smaller than the first global column select transistor (GY1).

According to the method described above, the bit line select circuit 120 can compensate for differences in word line parasitic resistance in accordance with a length of a word line. Thus, a current level provided to each memory cell can be uniformly maintained. This means an obtaining of sufficient read margin and an improvement of reliability of a memory cell.

Figure 4:
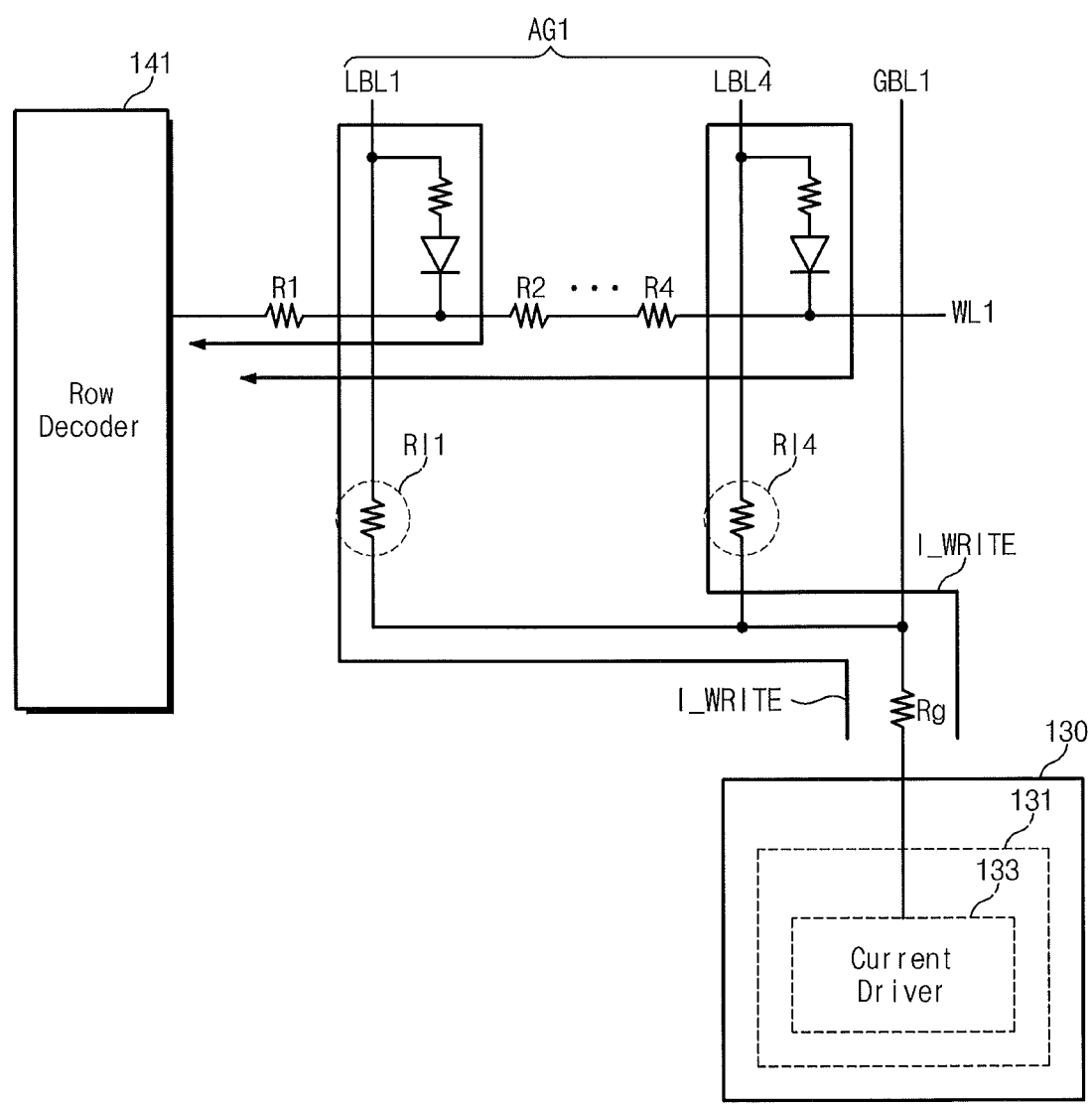
FIG. 4 is a circuit diagram illustrating a local column select transistor (LY) in accordance with some embodiments of the present inventive subject matter.

FIG. 4 is a circuit diagram illustrating a local column select transistor (LY) in accordance with some embodiments of the present inventive subject matter. In FIG. 4, it will be described that a word line parasitic resistance can be compensated by controlling the local column select transistor (LY).

Referring to FIG. 4, the local bit lines (LBL1~LBL4) of the first address group (AG1) and the first global bit line (GBL1) are illustrated. For example, data is written in the first memory cell (MC1) and the fourth memory cell (MC4). For a brief description, the first and fourth local column select transistors (LY1, LY4) are indicated by resistors (R11, R14). The global column select transistor (GY1) is indicated by a resistor (Rg).

The data buffer 130 includes a writing circuit 131. The writing circuit 131 includes a current driving circuit 133. However, this is only an illustration. For example, the data buffer 130 may include a read circuit (not illustrated). The writing circuit 131 and the read circuit may exist outside.

In the case that data is written in the first and fourth memory cells (MC1, MC4), the current driving circuit 133 transmits a write current (I_WRITE) to the first and fourth memory cells (MC1, MC4) in response to a control signal (CTR). For example, the current driving circuit 133 may transmit the write current (I_WRITE) to the first and fourth memory cell (MC1, MC4) in response to a reset pulse (P_RESET, not illustrated). The reset pulse (P_RESET) means a pulse for storing data '1'. For example, the current driving circuit 133 may transmit the write current (I_WRITE) to the first and fourth memory cell (MC1, MC4) in response to a set pulse (P_SET, not illustrated). The set pulse (P_SET) means a pulse for storing data '0'. For example, a level of the write current (I_WRITE) for a reset may be greater than a level of the write current (I_WRITE) for a set.

According to the method described above, the write current (I_WRITE) may be transferred to the first and fourth memory cells (MC1, MC4). However, even though the write current (I_WRITE) is transferred to the first and fourth memory cells (MC1, MC4) by the method described above, levels of the transferred write currents (I_WRITE) may be different. This is because a word line parasitic resistance between the fourth memory cell (MC4) and the row decoder 141 is greater than a word line parasitic resistance between the first memory cell (MC1) and the row decoder 141.

More specifically, assume that the write current (I_WRITE) is transferred to the first memory cell (MC1). In this case, the write current (I_WRITE) flows into the row decoder 141 through the first memory cell (MC1). A current path through which the write current (I_WRITE) flows is called a first current path (path_1, CP1). A resistance which exists in the first current path (CP1) may be indicated by 'Rg+R11+R1'. Here, the R1 means a word line parasitic resistance between the first memory cell (MC1) and the row decoder 141.

Also, it is assumed that the write current (I_WRITE) is transferred to the fourth memory cell (MC4). In this case, the write current (I_WRITE) flows into the row decoder 141 through the fourth memory cell (MC4). A current path through which the write current (I_WRITE) flows is called a fourth current path (path_4, CP4). A resistance which exists in the fourth current path (CP4) may be indicated by 'Rg+R11+R1+R2+ . . . +R4'. Here, the 'R1+R2+ . . . +R4' means a word line parasitic resistance between the fourth memory cell (MC4) and the row decoder 141.

Thus, a word line parasitic resistance is different according to a length between a memory cell and the row decoder 141. This means that even though the write current (I_WRITE) is transferred from the current driving circuit 133 to memory cells, levels of the write currents (I_WRITE) transferred to the memory cells may be different. More specifically, a level of the write current (I_WRITE) transferred to the first memory cell (MC1) is greater than a level of the write current (I_WRITE) transferred to the fourth memory cell (MC4).

As described with reference to FIG. 2, a phase change memory cell stores data using the write currents (I_WRITE) provided to a phase change material (GST). Thus, in a case of the fourth memory cell (MC4), a level of the write currents (I_WRITE) may be smaller than a reference level. In this case, a heat enough to change a state of the phase change material (GST) may not be generated. This means a reduction of a read margin or that wrong data may be stored. In a case of the first memory cell (MC1), a level of the write currents (I_WRITE) may be greater than a reference level. This means that the first memory cell is disadvantageous in an endurance aspect. Also, this means a reduction of a read margin or that wrong data may be stored.

Thus, the local column select transistors (LY) have different resistances and thereby a write current (I_WRITE) of uniform level is transferred to each memory cell. Referring back to FIG. 4, a resistance (R11) of the first local column select transistor may be greater than a resistance (R14) of the fourth local column select transistor. This is for compensating a difference of a word line parasitic resistance. For example, a resistance (R11) of the first local column select transistor is greater than a resistance (R14) of the fourth local column select transistor by 'R2+ . . . +R4'.

Although any memory cell of the first address group (AG1) is selected by the method described above, a difference of word line parasitic resistances in accordance with a length difference between the memory cell and the row decoder 141 may be compensated. That is, a resistance of a local column select transistor corresponding to a memory cell adjacent to the row decoder 141 may be greater than a resistance of a local column select transistor corresponding to a memory cell relatively distant from the row decoder 141.

A technical spirit of the present inventive subject matter may not be limited to the first address group (AG1). For example, a technical spirit of the present inventive subject matter may be applied to mth address group (AGm). Also, a technical spirit of the present inventive subject matter may be equally applied to different variable resistance memory cells besides a phase change memory cell.

Methods of controlling a resistance of a column select transistor may vary. For example, a resistance of a column select transistor can be controlled by controlling a size of the column select transistor. More specifically, a resistance of a column select transistor may be controlled to be small by enlarging a channel width of a column select transistor. A resistance of a column select transistor may be controlled to be small by reducing a channel length of a column select transistor. That is, a resistance of a column select transistor may be controlled by controlling a ratio of W/L.

Also, a resistance of a column select transistor may be controlled by controlling a channel doping concentration of a column select transistor. An impurity is doped in a channel region of a transistor to control a threshold voltage of a transistor. In this case, as doping concentration of a channel region is high, a threshold voltage becomes low. Thus, a resistance of a column select transistor may be controlled to be low.

Figure 5:
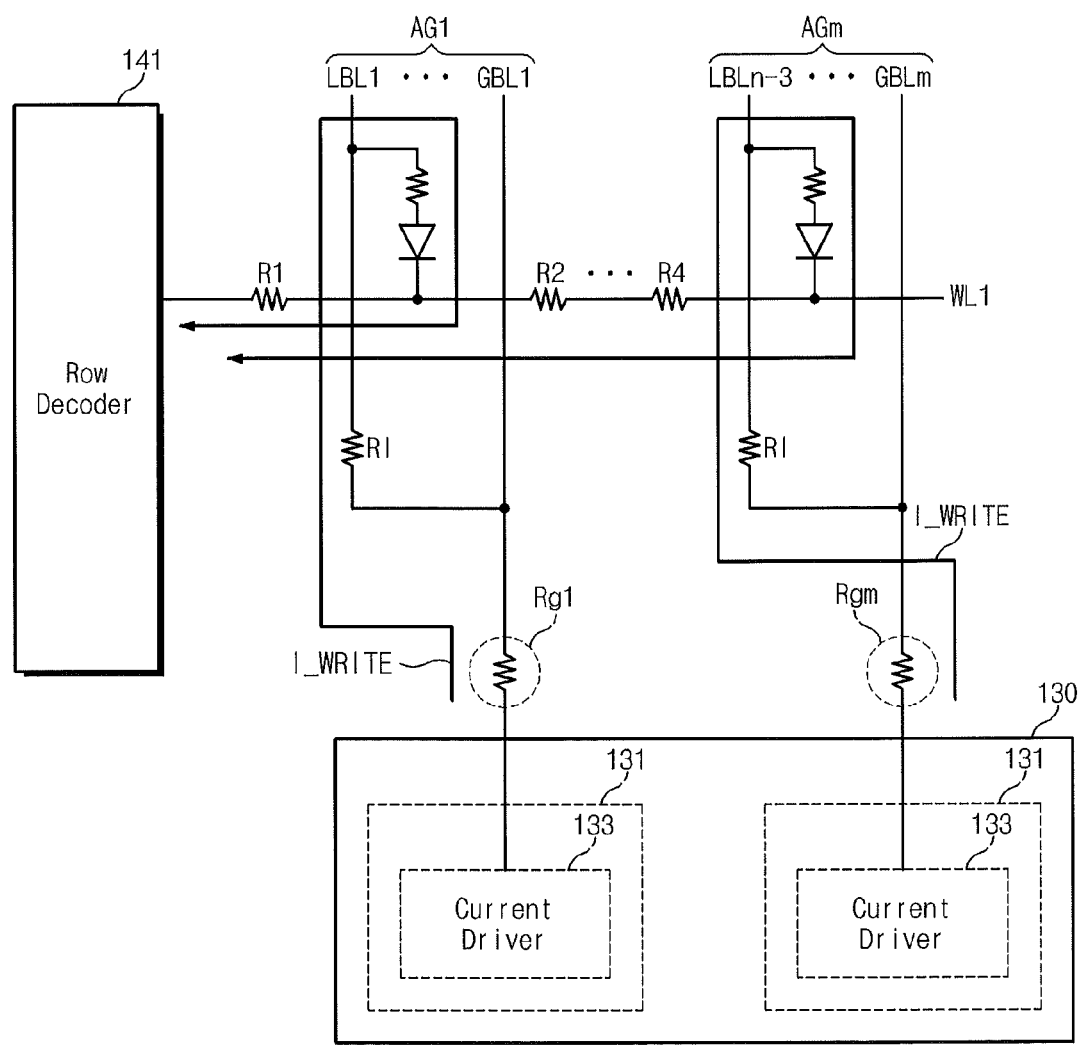
FIG. 5 is a circuit diagram illustrating a global column select transistor (GY) in accordance with some embodiments of the present inventive subject matter.

FIG. 5 is a circuit diagram illustrating a global column select transistor (GY) in accordance with some embodiments of the present inventive subject matter. In FIG. 5, it will be described that a word line parasitic resistance may be compensated by controlling a resistance of a global column select transistor (GY).

Referring to FIG. 5, a first address group (AG1) and an mth address group (AGm) are illustrated. For example, it is assumed that data is written in a first memory cell (MC1) and an n-3th memory cell (MCn-3). For a brief description, first and an mth global column select transistors (GY1, GYm) are indicated by Rg1 and Rgm, respectively. First and n-3th local column select transistors (LY1, Lyn-3) are indicated by R1. In this case, it is assumed that resistances of the first and n-3th local column select transistors (LY1, Lyn-3) are identical to each other.

The global column select transistors (GY) have different resistances and thereby a difference of a word line parasitic resistance may be compensated. That is, the global column select transistors (GY) can compensate for differences in word line parasitic resistance in accordance with a distance difference between the address group (AG) and the row decoder 141.

When data is written in the first and n-3th memory cells (MC1, MCn-3), a write current (I_WRITE) is transferred to the first and n-3th memory cells (MC1, MCn-3). Since a generation of the write current (I_WRITE) by the current driving circuit 133 was described with reference to FIG. 4 in detail, a detailed description is omitted.

Even though the write current (I_WRITE) of a uniform level is generated by the current driving circuit 133, levels of the write currents (I_WRITE) transferred to the first and n-3th memory cells (MC1, MCn-3) may be different. This is because a word line parasitic resistance between the mth address group (AGm) and the row decoder 141 is greater than a word line parasitic resistance between the first address group (AG1) and the row decoder 141.

More specifically, assume that the write current (I_WRITE) is transferred to the first memory cell (MC1). In this case, the write current (I_WRITE) flows into the row decoder 141 through the first memory cell (MC1). A current path through which the write current (I_WRITE) flows is called a first current path (CP1). A resistance existing in the first current path (CP1) may be indicated by 'Rg1+R1+R1'. Here, R1 means a word line parasitic resistance between the first memory cell (MC1) and the row decoder 141. That is, R1 means a word line parasitic resistance between the first address group (AG1) and the row decoder 141.

Also, assume that the write current (I_WRITE) is transferred to the n-3th memory cell (MCn-3). In this case, the write current (I_WRITE) flows into the row decoder 141 through the n-3th memory cell (MCn-3). A current path through which the write current (I_WRITE) flows is called an n-3th current path (CPn-3). A resistance existing in the n-3th current path (CPn-3) may be indicated by 'Rgm+R1+R1+R2+ . . . +Rm'. Here, 'R1+R1+R2+ . . . +Rm' means a word line parasitic resistance between the n-3th memory cell (MCn-3) and the row decoder 141. That is, 'R1+R1+R2+ . . . +Rm' means a word line parasitic resistance between the mth address group (AGm) and the row decoder 141.

As described above, the first current path (CP1) and the n-3th current path (CPn-3) have different word line parasitic resistances. As described with reference to FIG. 4, this means a reduction of a read margin or that wrong data may be stored.

Thus, the global column select transistors (GY) have different resistances and thereby the write current (I_WRITE) of a uniform level is transferred to each address group (AG). For example, the resistance Rg1 of the first global column select transistor is greater than the resistance Rgm of the mth global column select transistor by 'R2+ . . . +Rm'. For example, a resistance of a global column select transistor corresponding to an address group (AG) adjacent to the row decoder 141 is relatively greater than a resistance of a global column select transistor corresponding to an address group (AG) distant from the row decoder 141.

Since a method of controlling resistances of global column select transistors is identical to the method of controlling resistances of global column select transistors described in FIG. 4, a detail description is omitted. Also, a technical spirit of the present inventive subject matter may be applied to different variable resistance memory cell besides a phase change memory cell.

Figure 6:
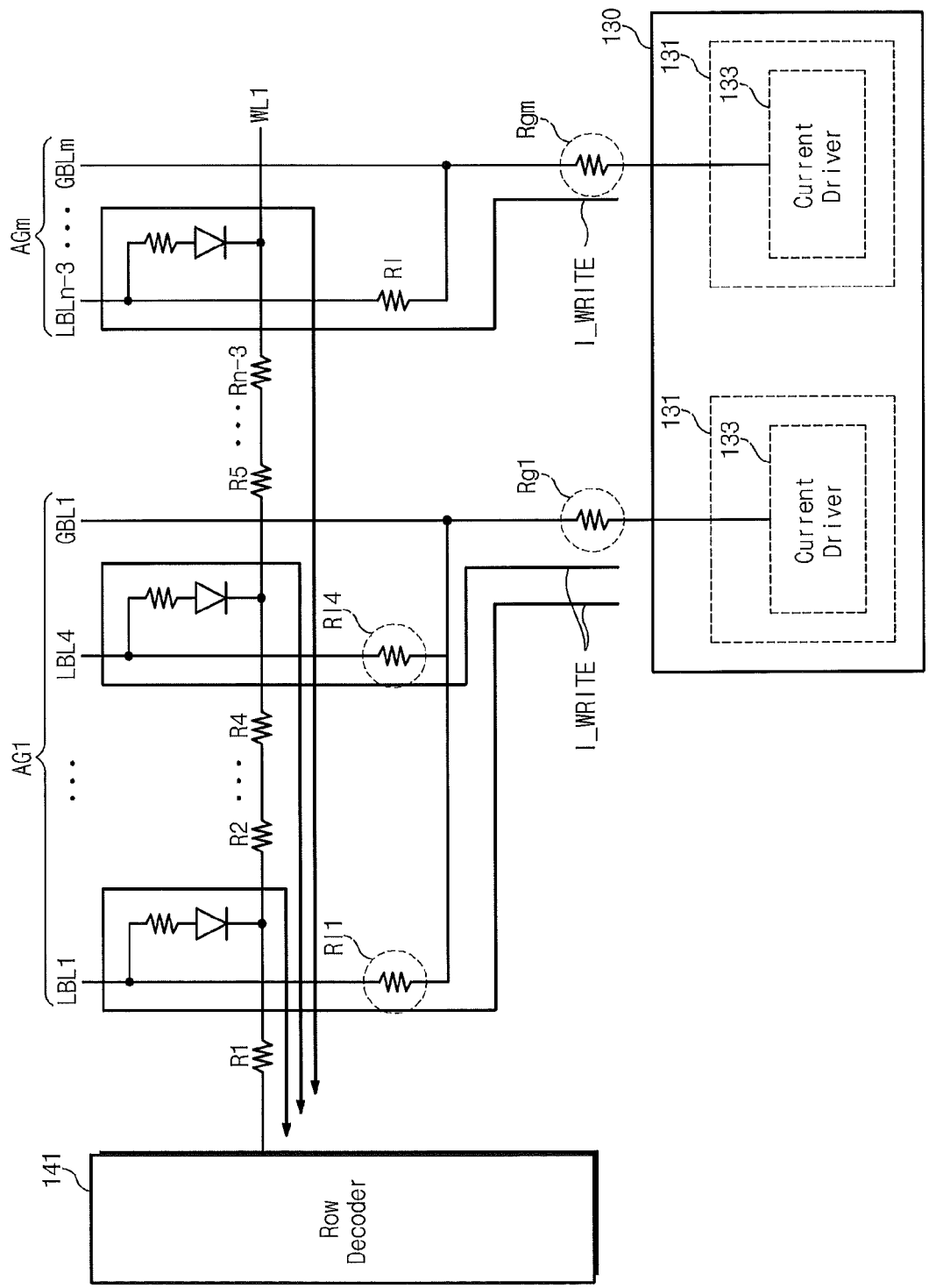
FIG. 6 is a circuit diagram illustrating a local column select transistor (LY) and a global row select transistor (GY) in accordance with some embodiments of the present inventive subject matter.

FIG. 6 is a circuit diagram illustrating a local column select transistor (LY) and a global row select transistor (GY) in accordance with some embodiments of the present inventive subject matter. In FIG. 6, it will be described that a word line parasitic resistance can be compensated by controlling a resistance of the global row select transistor (GY) and a resistance of the local column select transistor (LY).

Referring to FIG. 6, a first address group (AG1) and an mth address group (AGm) are illustrated. For a brief description, it is assumed that data is written in a first memory cell (MC1) and an n-3th memory cell (MCn-3). First and an mth global column select transistors (GY1, GYm) are indicated by Rg1 and Rgm, respectively. First and n-3th local column select transistors (LY1, Lyn-3) are indicated by R11 and R1n-3.

The global column select transistors (GY) have different resistances and thereby a difference of a word line parasitic resistance between the address group (AG) and the row decoder 141 may be compensated. The local column select transistors in accordance with some embodiments of the present inventive subject matter have different resistances, thereby compensating a word line parasitic resistance in the address group (AG).

More specifically, as the address group (AG) corresponding to the global column select transistors (GY) is adjacent to the row decoder, the global column select transistors (GY) has a great resistance. This was described with reference to FIG. 5, so a detailed description is omitted. For example, the resistance (Rg1) of the first global column select transistor is greater than the resistance (Rgm) of the mth global column select transistor.

Also, as the memory cell corresponding to the local column select transistors (LY) is adjacent to the row decoder, the local column select transistors (LY) has a great resistance. This was described with reference to FIG. 5, so a detailed description is omitted. For example, the resistance (R11) of the first local column select transistor is greater than the resistance (R14) of the fourth local column select transistor.

A write current (I_WRITE) transferred to each memory cell (MC) can be more precisely controlled by the method described above. That is, the global column select transistors (GY) can compensate the word line parasitic resistance by the address group (AG) and the local column select transistors (LY) can compensate the word line parasitic resistance by the memory cell (MC).

A technical spirit of the present inventive subject matter may be equally applied to different variable resistance memory cell besides a phase change memory cell.

Figure 7:
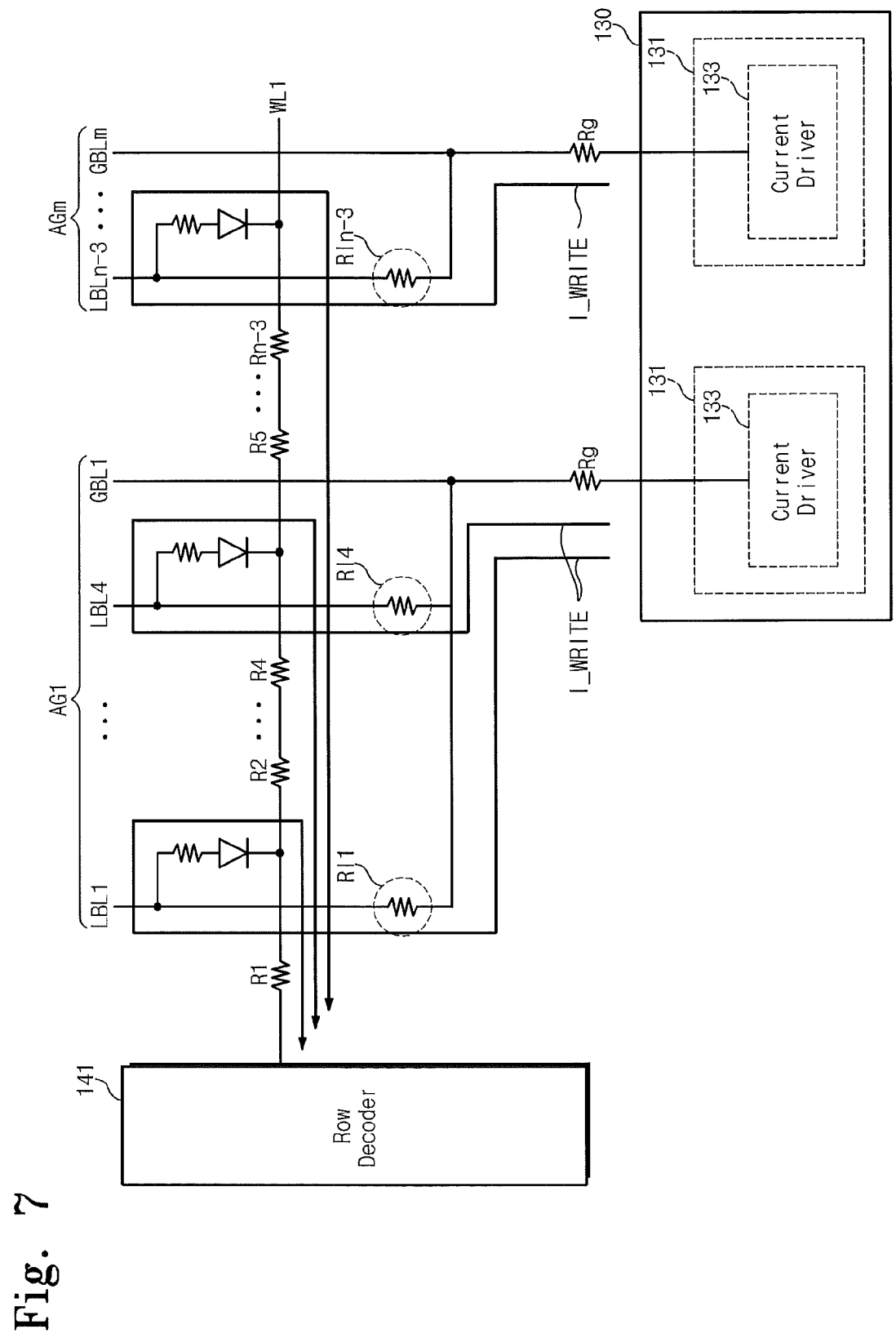
FIG. 7 is a circuit diagram illustrating a local column select transistor (LY) in accordance with further embodiments of the present inventive subject matter.

FIG. 7 is a circuit diagram illustrating a local column select transistor (LY) in accordance with further embodiments of the present inventive subject matter. In FIG. 7, it will be described that a word line parasitic resistance can be compensated by controlling a resistance of the local column select transistor (LY).

Referring to FIG. 7, a first address group (AG1) and an mth address group (AGm) are illustrated. For a brief description, it is assumed that data is written in a first memory cell (MC1), a fourth memory cell (MC4) and an n-3th memory cell (MCn-3). First and an mth global column select transistors (GY1, GYm) are indicated by Rg. In this case, a resistance of the first global column select transistor is identical to a resistance of the mth global column select transistor. First, fourth and n-3th local column select transistors (LY1, LY4, Lyn-3) are indicated by R11, R14 and R1$n$-3.

The local column select transistors (LY) have different resistances and thereby a difference of a word line parasitic resistance may be compensated. The local column select transistors (LY) in accordance with some embodiments of the present inventive subject matter have different resistances, thereby compensating a difference of a word line parasitic resistance between the address group (AG) and the row decoder. Also, the local column select transistors (LY) in accordance with some embodiments of the present inventive subject matter have different resistances, thereby precisely compensating a difference of a word line parasitic resistance in the same address group (AG).

More specifically, the local column select transistors (LY) have different resistances and thereby a word line parasitic resistance can be compensated by the address group (AG). For example, the resistance R11 of the first local column select transistor may be greater than the resistance Rn-3 of the n-3th local column select transistor. This is similar to the thing described in FIG. 4, so a detailed description is omitted.

Also, the local column select transistors (LY) have different resistances and thereby a word line parasitic resistance can be compensated by the memory cell (MC). For example, the resistance R11 of the first local column select transistor may be greater than the resistance R14 of the fourth local column select transistor. This is similar to the things described in FIG. 4, so a detailed description is omitted.

A write current (I_WRITE) of a uniform level can be transferred to each memory cell (MC) by the method described above. This means that each memory cell (MC) can have a sufficient read margin. Also, wrong data is prevented from being written in each memory (MC).

A technical spirit of the present inventive subject matter may be equally applied to different variable resistance memory cell besides a phase change memory cell.

Figure 8:
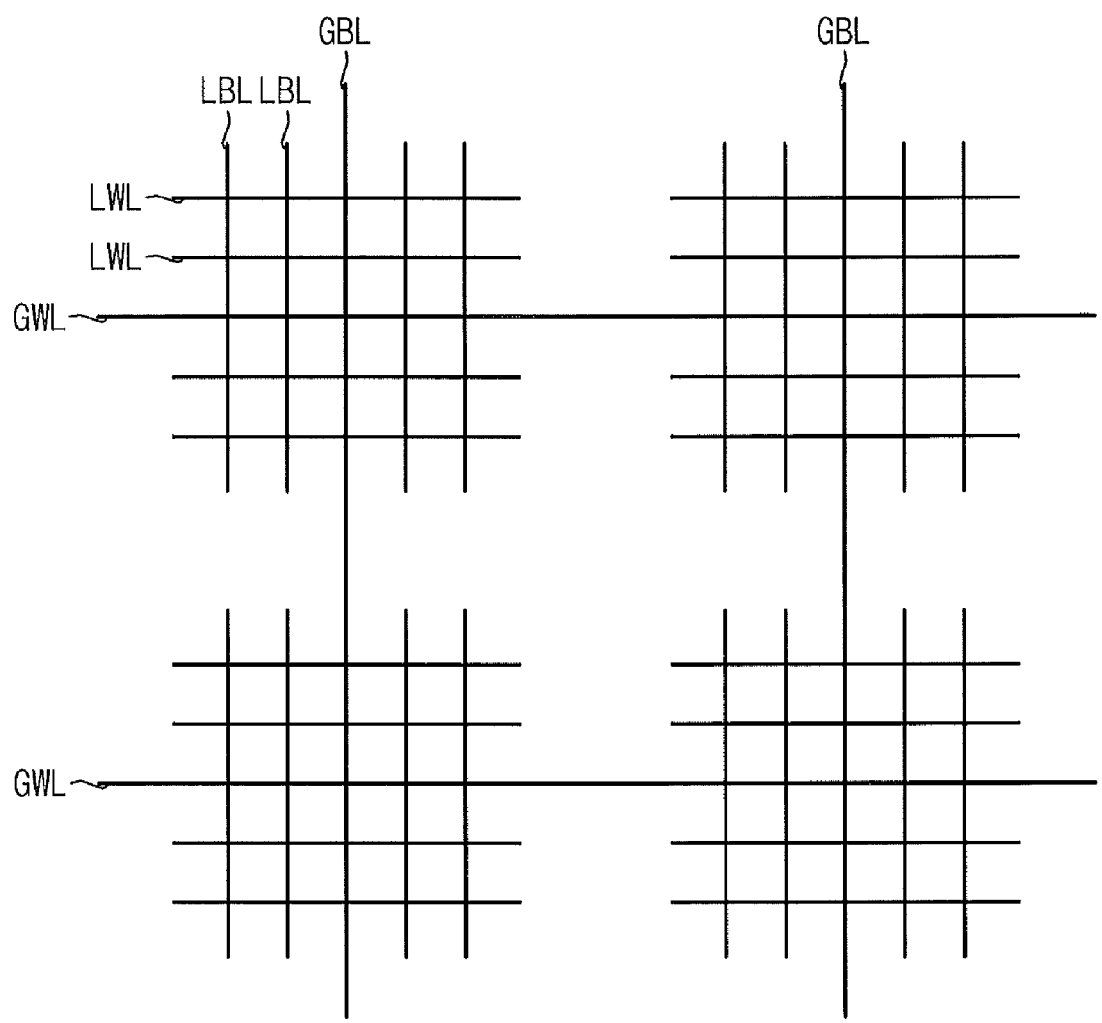
FIG. 8 is a drawing illustrating a layout structure of a semiconductor memory device in accordance with some embodiments of the present inventive subject matter.

FIG. 8 is a drawing illustrating a layout structure of a semiconductor memory device in accordance with further embodiments of the present inventive subject matter.

Referring to FIG. 8, a phase change memory device in accordance with the present inventive subject matter includes bit lines (BL) and word lines (WL) having a hierarchical structure. The bit lines (BL) include global bit lines (GBL) and local bit lines (LBL). The word lines (WL) include global word lines (GWL) and local word lines (LWL).

In embodiment of the present inventive subject matter, column select transistors can compensate differences in the local word line parasitic resistance and differences in the global word line parasitic resistance. For example, local column select transistors (LY) can compensate for differences in the local word line parasitic resistance. Global column select transistors (GY) can compensate for differences in the global word line parasitic resistance. This is similar to the things described in FIGS. 4 through 7, so a detailed description is omitted.

A technical spirit of the present inventive subject matter may not be limited thereto. The local column select transistors (LY) can compensate for differences in the global word line parasitic resistance. This is similar to the thing described in FIG. 7, so a detailed description is omitted.

Figure 9:
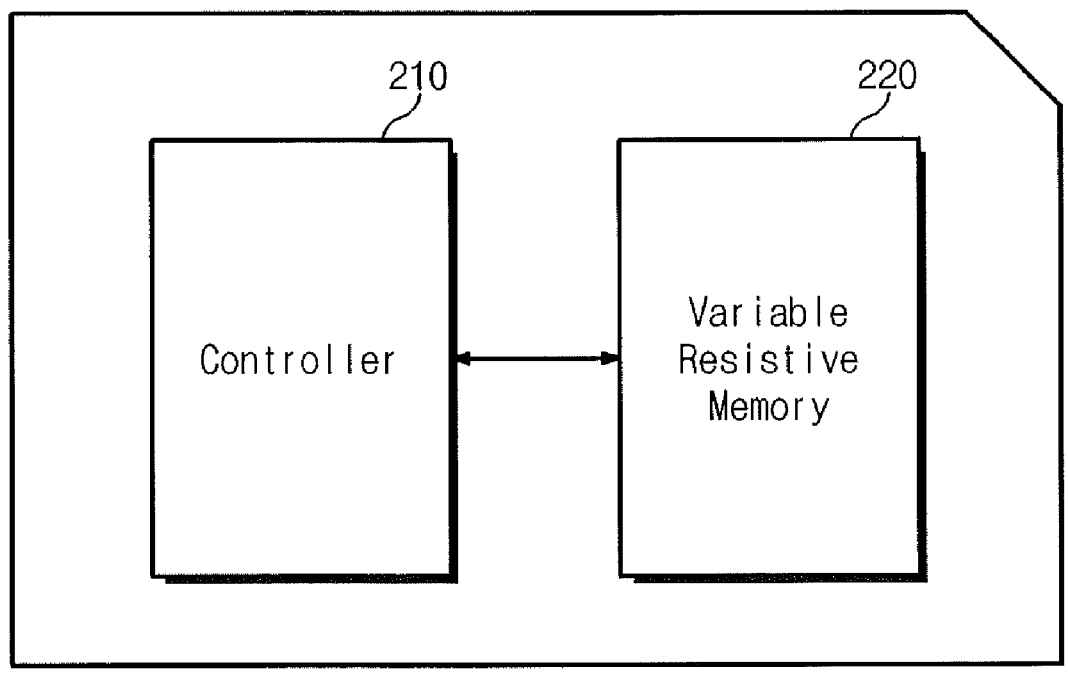
FIG. 9 is a block diagram illustrating a memory system 200 in accordance with some embodiments of the present inventive subject matter.

FIG. 9 is a block diagram illustrating a memory system 200 in accordance with some embodiments of the present inventive subject matter.

Referring to FIG. 9, the memory system 200 includes a controller 210 and a variable resistance memory device 220.

The controller 210 is connected to a host and the variable resistance memory device 220. The controller 210 transmits data read from the variable resistance memory device 220 to the host or stores data transferred from the host in the variable resistance memory device 220.

The controller 210 includes RAM, a processing unit, a host interface and a memory interface. The RAM is used as an operation memory of the processing unit. The processing unit controls every operation of the controller 210. The host interface includes a protocol for data exchange between the host and the controller 210. For example, the controller 210 may be configured to communicate with the outside (the host) through one of various interface protocols such as USB, MMC, PCI_E, ATA (advanced technology attachment), serial-ATA, parallel-ATA, SCSI, ESDI and IDE (integrated drive electronics). The memory interface may interface with the variable resistance memory device 220. The controller 210 may further include an error correction block. The error correction block detects an error of data read from the variable resistance memory device 220 and then corrects the detected error.

The controller 210 and the variable resistance memory device 220 can be integrated in one semiconductor device. For example, the controller 210 and the variable resistance memory device 220 are integrated in one semiconductor device to constitute a memory card. As another illustration, the controller 210 and the variable resistance memory device 220 are integrated in one semiconductor device to constitute a solid state drive (SSD). When the memory system 200 is used as a solid state drive (SSD), an operation speed of the host connected to the memory system 200 may be greatly improved.

Figure 10:
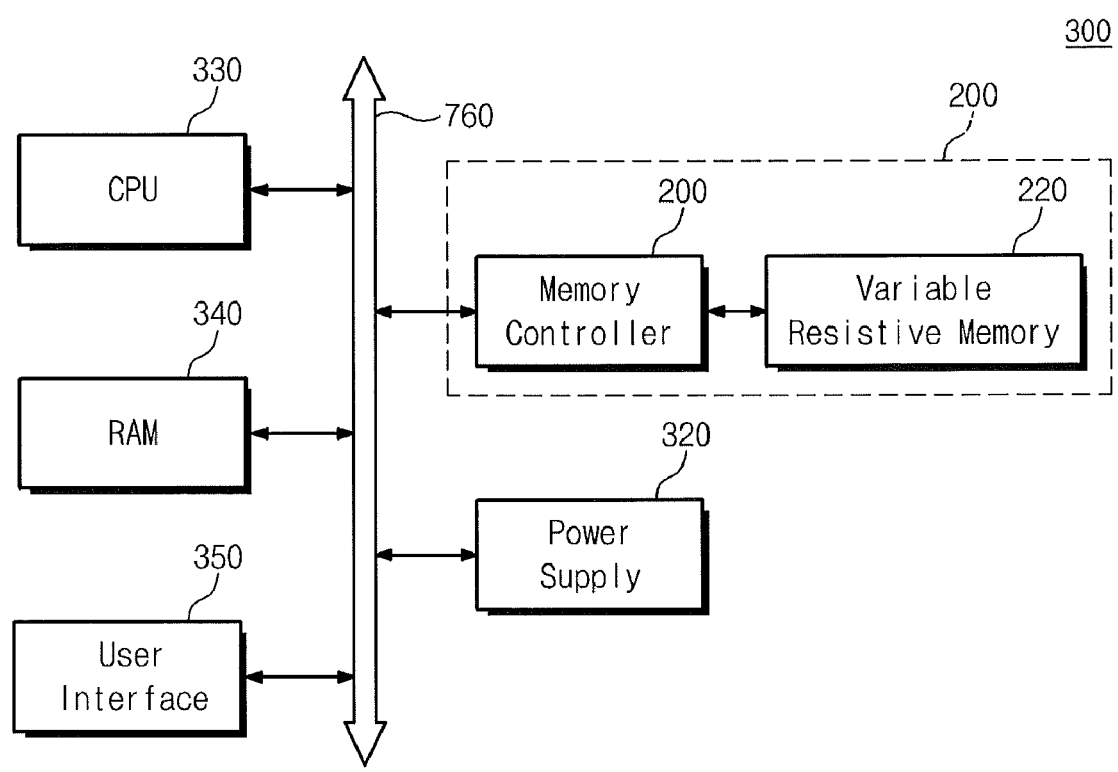
FIG. 10 is a block diagram illustrating a computing system 300 including the memory system 200 illustrating in FIG. 9.

FIG. 10 is a block diagram illustrating a computing system 300 including the memory system 200 illustrating in FIG. 9. Referring to FIG. 10, the computing system 300 in accordance with some embodiments of the present inventive subject matter includes a central processing device 310, a random access memory (RAM) 320, a user interface 330, a power supply 340 and a memory system 200.

The memory system 200 is electrically connected to the central processing device 310, the random access memory (RAM) 320, the user interface 330, the power supply 340 through a system bus 360. Data provided through the user interface 330 and processed by the central processing device 310 are stored in the memory system 200. The memory system 200 includes a controller 210 and a variable resistance memory device 220. In the drawing, the variable resistance memory device 220 is connected to the system bus 360 through the controller 210. However, as another illustration, the variable resistance memory device 220 may be directly connected to the system bus 360.

When the memory system 200 is a solid state drive (SSD), a booting speed of the computing system 300 can be greatly improved. Although not illustrated in the drawing, the system in accordance with the present inventive subject matter may further include an application chipset, a camera image processor or the like.

The above-disclosed subject matter is to be considered illustrative, and not restrictive, and the appended claims are intended to cover all such modifications, enhancements, and other embodiments, which fall within the true spirit and scope of the inventive subject matter. Thus, to the maximum extent allowed by law, the scope of the inventive subject matter is to be determined by the broadest permissible interpretation of the following claims and their equivalents, and shall not be restricted or limited by the foregoing detailed description.

What is claimed is:

1. A memory device comprising:
a row decoder;
a first variable resistance memory cell connected to a first bit line and connected to the row decoder by a word line;
a second variable resistance memory cell connected to a second bit line and connected to the row decoder by the word line; and
a bit line select circuit coupled to the first and second bit lines and configured to compensate for a difference in word line resistance between the row decoder and the respective first and second memory cells.

2. The memory device of claim 1, wherein the bit line select circuit comprises first and second transistors configured to select respective ones of the first and second bit lines and wherein the first and second transistors have different resistances that compensate for the difference in word line resistance.

3. The memory device of claim 2, wherein the first and second transistors have different channel lengths that compensate for the difference in word line resistance.

4. The memory device of claim 2, wherein the first and second transistors have different channel widths that compensate for the difference in word line resistance.

5. A memory device comprising:
a row decoder;
a plurality of variable resistance memory cell blocks comprising a first variable resistance memory cell block coupled to the row decoder by a word line and a second variable resistance memory cell block coupled to the row decoder by the word line;
first and second global bit lines coupled to respective ones of the first and second variable resistance memory cell blocks; and
a global bit line select circuit coupled to the first and second bit lines and configured to compensate for a difference in word line resistance between the row decoder and the respective first and second variable resistance memory cell blocks.

6. The memory device of claim 5, wherein the global bit line select circuit comprises respective first and second transistors configured to select respective ones of the first and second global bit lines, and wherein the first and second transistors have different resistances to thereby compensate for the difference in word line resistance.

7. The memory device of claim 6, wherein the first and second transistors have different channel lengths that compensate for the difference in word line resistance.

8. The memory device of claim 6, wherein the first and second transistors have different channel widths that compensate for the difference in word line resistance.

9. The memory device of claim 5, further comprising:
a plurality of local bit lines, respective groups of which are configured to couple memory cells of respective ones of the variable resistance memory cell blocks to respective ones of the global bit lines;
a plurality of global word lines;
a plurality of local word lines, respective groups of which are coupled to respective ones of the global word lines; and
a local bit line selection circuit configured to selectively couple bit lines of the respective groups of local bit lines to respective ones of the global bit lines and further configured to compensate for differences in local word line resistance between the global word lines and memory cells in the variable resistance memory cell blocks.

10. The memory device of claim 9, wherein the local bit line select circuit comprises respective local bit line select transistors configured to couple respective ones of the local bit lines to the global bit lines and wherein the local bit line select transistors have different resistances that compensate for the differences in local word line resistance.

11. A memory device comprising:
a row decoder;
a first variable resistance memory cell connected to a first bit line and connected to the row decoder by a word line;
a second variable resistance memory cell connected to a second bit line and connected to the row decoder by the word line;
a data buffer circuit; and
a bit line select circuit configured to selectively couple the first and second bit lines to the data buffer circuit and to provide different resistances between the data buffer circuit and the respective first and second bitlines to compensate for a difference in word line resistance between the row decoder and the respective first and second memory cells.

12. The memory device of claim 11, wherein the bit line select circuit comprises first and second transistors configured to couple respective ones of the first and second bit lines to the data buffer circuit and wherein the first and second transistors have different resistances that compensate for the difference in word line resistance.

13. The memory device of claim 12, wherein the first and second transistors have different channel lengths that compensate for the difference in word line resistance.

14. The memory device of claim 12, wherein the first and second transistors have different channel widths that compensate for the difference in word line resistance.

* * * * *